US011196396B2

(12) United States Patent

Liu et al.

(10) Patent No.: US 11,196,396 B2

(45) Date of Patent: Dec. 7, 2021

(54) OPERATIONAL AMPLIFIER

(71) Applicant: Himax Technologies Limited, Tainan (TW)

(72) Inventors: Chun-Yu Liu, Tainan (TW); Ping-Liang Chen, Tainan (TW)

(73) Assignee: Himax Technologies Limited, Tainan (TW)

( * ) Notice: Subject to any disclaimer, the term of this patent is extended or adjusted under 35 U.S.C. 154(b) by 72 days.

(21) Appl. No.: 16/789,224

(22) Filed: Feb. 12, 2020

(65) Prior Publication Data

US 2021/0250003 A1 Aug. 12, 2021

(51) Int. Cl.

*H03F 3/45* (2006.01)

*H03F 1/52* (2006.01)

(52) U.S. Cl.

CPC ........... *H03F 3/45076* (2013.01); *H03F 1/52* (2013.01); *H03F 2200/426* (2013.01)

(58) Field of Classification Search

CPC ............. H03F 3/45183; H03F 3/45179; H03F 3/45192; H03F 3/45188; H03F 3/45475

USPC ......... 327/108–112, 560–563; 333/252–253; 330/252–253

See application file for complete search history.

(56) References Cited

U.S. PATENT DOCUMENTS 7,154,332 B2 * 12/2006 Tsuchi .................. H03F 3/3022 330/255

7,573,333 B2 * 8/2009 Yokota .................. H03F 3/3022 330/255

7,652,538 B2 * 1/2010 Choi ......................... H03F 1/34 330/292

2004/0214543 A1 * 10/2004 Osone ................ H01H 59/0009 455/197.2

2014/0125414 A1 * 5/2014 Chen ................... H03F 3/45224 330/261

2015/0381116 A1 * 12/2015 Wu ........................... H03F 3/24 330/253

* cited by examiner

*Primary Examiner* — Quan Tra

(74) *Attorney, Agent, or Firm* — Donald E. Stout; Stout, Uxa & Buyan, LLP

(57) ABSTRACT

An operational amplifier includes a first output transistor and a second output transistor connected in series between two power nodes, the second output transistor having a semiconductor type opposite to the first output transistor, the first output transistor and the second output transistor being electrically coupled at an output node, and gates of the first output transistor and the second output transistor being connected to a first drive node and a second drive node respectively; and a decoupling capacitor circuit electrically connected between the first drive node and the second drive node.

11 Claims, 3 Drawing Sheets

OPERATIONAL AMPLIFIER

BACKGROUND OF THE INVENTION

1. Field of the Invention

The present invention generally relates to an operational amplifier, and more particularly to an output stage of the operational amplifier.

2. Description of Related Art

An operational amplifier (op-amp) is a DC-coupled high-gain electronic voltage amplifier, which is one type of differential amplifier usually with a differential input and a single-ended output. The operational amplifier has been widely used in variety of consumer, industrial, and scientific devices.

A class-AB circuit is commonly used as the output buffer of the operational amplifier. However, in conventional operational amplifiers, output swing may ordinarily couple back to push-pull stage to cause short current in the output buffer in AC period. Moreover, voltage fluctuation commonly occurs in the output stage of the conventional operational amplifiers. According to characteristics of the operational amplifier, more alternating-current (AC) current may be conserved when voltage transition occurs more frequently.

A need has thus arisen to propose a novel operational amplifier to overcome the drawbacks of the conventional operational amplifiers.

SUMMARY OF THE INVENTION

In view of the foregoing, it is an object of the embodiment of the present invention to provide an operational amplifier capable of stabilizing the output stage, decreasing short current and suppressing voltage fluctuation in the output stage.

According to one embodiment, an operational amplifier includes a first output transistor, a second output transistor and a decoupling capacitor circuit. The first output transistor and the second output transistor are connected in series between two power nodes, the second output transistor has a semiconductor type opposite to the first output transistor, the first output transistor and the second output transistor are electrically coupled at an output node, and gates of the first output transistor and the second output transistor are connected to a first drive node and a second drive node respectively. The decoupling capacitor circuit is electrically connected between the first drive node and the second drive node.

DETAILED DESCRIPTION OF THE INVENTION

Figure 1:
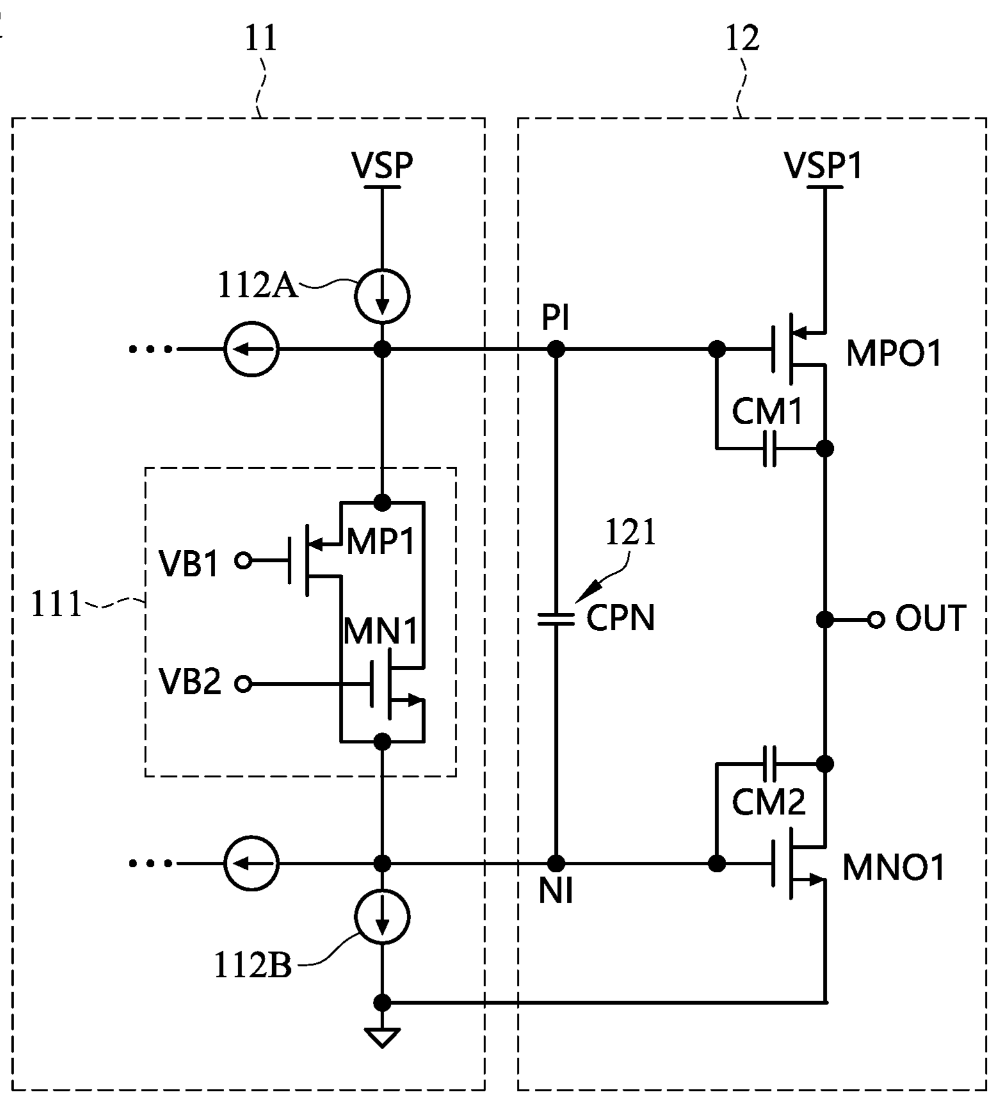
FIG. 1 shows a circuit diagram illustrating an operational amplifier according to a first embodiment of the present invention.

FIG. 1 shows a circuit diagram illustrating an operational amplifier 100 according to a first embodiment of the present invention, adaptable to, but not necessarily, a source driver of a flat panel display such as a liquid crystal display (LCD). The operational amplifier 100 of the embodiment may primarily include a floating current input stage 11 and an output stage 12.

In the embodiment, the output stage 12 may include a first output transistor MPO1 (e.g., p-channel metal-oxide-semiconductor field-effect transistor (PMOS)) and a second output transistor MNO1 (e.g., n-channel metal-oxide-semiconductor field-effect transistor (NMOS)) connected in series between two power nodes such as a positive supply voltage VSP1 and a ground. Therefore, the operational amplifier may operate in positive power range. Alternatively, in the present embodiment and the following embodiments, the two power nodes may be the ground and a negative supply voltage. Therefore, the operational amplifier may operate in negative power range. The second output transistor MNO1 has a semiconductor type opposite to the first output transistor MPO1. Specifically, drains of the first output transistor MPO1 and the second output transistor MNO1 are electrically coupled at an output node OUT. Sources of the first output transistor MPO1 and the second output transistor MNO1 are electrically connected to the power VSP1 and the ground, respectively. Gates of the first output transistor MPO1 and the second output transistor MNO1 are connected to a first drive node PI and a second drive node NI, respectively.

The output stage 12 may include a first Miller capacitor CM1 and a second Miller capacitor CM2 electrically connected to the first output transistor MPO1 and the second output transistor MNO1 respectively to increase stability of the output stage 12. In one embodiment, as shown in FIG. 1, the first Miller capacitor CM1 is electrically connected between the gate and the drain of the first output transistor MPO1, and the second Miller capacitor CM2 is electrically connected between the gate and the drain of the second output transistor MNO1. Alternatively speaking, the first Miller capacitor CM1 is electrically connected between the first drive node PI and the output node OUT, and the second Miller capacitor CM2 is electrically connected between the second drive node NI and the output node OUT.

According to one aspect of the embodiment, the output stage 12 may include a decoupling capacitor circuit 121 for stabilizing the output stage 12. In one embodiment, as shown in FIG. 1, the decoupling capacitor circuit 121 is electrically connected between the first drive node PI and the second drive node NI, and the decoupling capacitor circuit 121 may include a single decoupling capacitor CPN capable of stabilizing voltages at the first drive node PI and the second drive node NI respectively.

In the embodiment, the floating current input stage 11 may include a floating current circuit 111. In one embodiment, as shown in FIG. 1, the floating current circuit 111 is electrically connected between the first drive node PI and the second drive node NI, and the floating current circuit 111 includes a (first) floating current source composed of a first floating transistor MP1 (e.g., PMOS) and a second floating transistor MN1 (e.g., NMOS) electrically connected in parallel. The first floating transistor MP1 has a semiconductor type opposite to the second floating transistor MN1. Specifically, a source of the first floating transistor MP1 and a drain of the second floating transistor MN1 are electrically coupled to the first drive node PI. A drain of the first floating transistor MP1 and a source of the second floating transistor MN1 are electrically coupled to the second drive node NI. Gates of the first floating transistor MP1 and the second floating transistor MN1 are coupled to receive a first bias voltage VB1 and a second bias voltage VB2, respectively. Further, a first current source 112A may be electrically connected between the floating current circuit 111 and a power VSP (which may be the same as or different from the power VSP1 of the output stage 12), and a second current source 112B may be electrically connected between the floating current circuit 111 and the ground.

According to the operational amplifier 100 as set forth above, the voltage at the output node OUT increases when the voltages at the first drive node PI and the second drive node NI decrease. The increased voltage at the output node OUT may then pull up the voltages at the first drive node PI and the second drive node NI via the first Miller capacitor CM1 and the second Miller capacitor CM2 respectively, thereby stabilizing the output stage 12 and decreasing short current. Similarly, the voltage at the output node OUT decreases when the voltages at the first drive node PI and the second drive node NI increase. The decreased voltage at the output node OUT may then pull down the voltages at the first drive node PI and the second drive node NI via the first Miller capacitor CM1 and the second Miller capacitor CM2 respectively, thereby stabilizing the output stage 12 and decreasing short current. Moreover, the decoupling capacitor CPN of the decoupling capacitor circuit 121 may increase capacitance between the first drive node PI and the second drive node NI, thereby suppressing voltage fluctuation between the first drive node PI and the second drive node NI.

Figure 2:
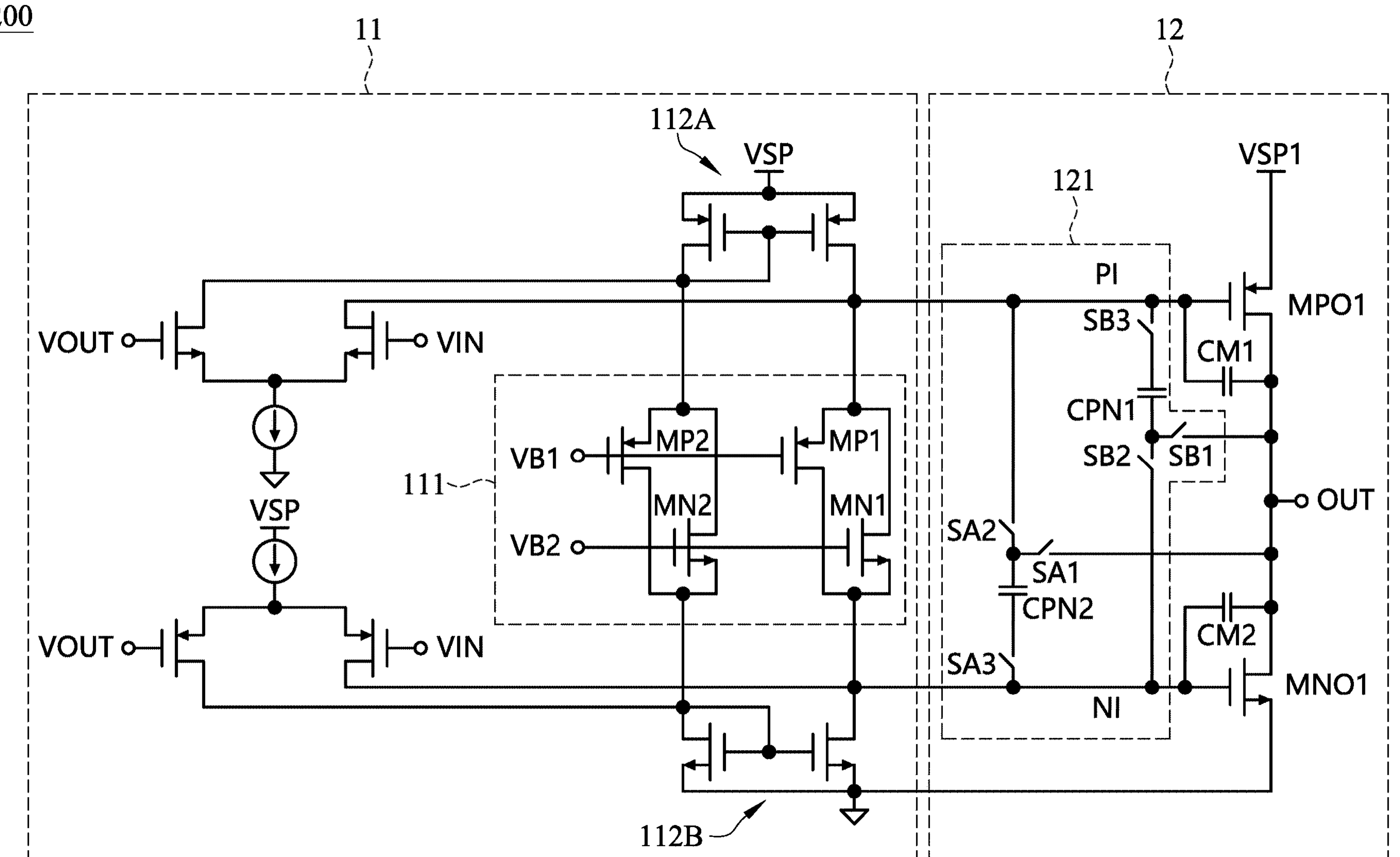
FIG. 2 shows a circuit diagram illustrating an operational amplifier according to a second embodiment of the present invention.

FIG. 2 shows a circuit diagram illustrating an operational amplifier 200 according to a second embodiment of the present invention. The operational amplifier 200 of FIG. 2 is similar to the operational amplifier 100 of FIG. 1 with the following exceptions.

In the embodiment, the decoupling capacitor circuit 121 may include a first decoupling capacitor CPN1 and a second decoupling capacitor CPN2, which are switchably connected in parallel between the first drive node PI and the second drive node NI. Specifically, a first end of the first decoupling capacitor CPN1 is electrically connected to the output node OUT via an (optional) first switch SB1, and to the second drive node NI via a second switch SB2; and a second end of the first decoupling capacitor CPN1 is electrically connected to the first drive node PI via a third switch SB3. A first end of the second decoupling capacitor CPN2 is electrically connected to the output node OUT via an (optional) fourth switch SA1, and to the first drive node PI via a fifth switch SA2; and a second end of the second decoupling capacitor CPN2 is electrically connected to the second drive node NI via a sixth switch SA3. In operation, the first switch SB1 and the fourth switch SA1 are open, and other switches SB2, SB3, SA2 and SA3 are closed, such that the first decoupling capacitor CPN1 and the second decoupling capacitor CPN2 are connected in parallel between the first drive node PI and the second drive node NI, thereby increasing decoupling capacitance. In another operation, the second switch SB2 and the fifth switch SA2 are open, and other switches SB1, SB3, SA1 and SA3 are closed, such that the first decoupling capacitor CPN1 and the first Miller capacitor CM1 are connected in parallel and the second decoupling capacitor CPN2 and the second Miller capacitor CM2 are connected in parallel, thereby increasing respective Miller capacitance.

In the embodiment, the floating current circuit 111 has a folded structure by folding the first floating current source (composed of MP1 and MN1) over with a second floating current source composed of a third floating transistor MP2 (e.g., PMOS) and a fourth floating transistor MN2 (e.g., NMOS) electrically connected in parallel. The third floating transistor MP2 has a semiconductor type opposite to the fourth floating transistor MN2. Specifically, a source of the third floating transistor MP2 and a drain of the fourth floating transistor MN2 are electrically coupled together. A drain of the third floating transistor MP2 and a source of the fourth floating transistor MN2 are electrically coupled together. Gates of the third floating transistor MP2 and the fourth floating transistor MN2 are coupled to receive the first bias voltage VB1 and the second bias voltage VB2, respectively.

Figure 3:
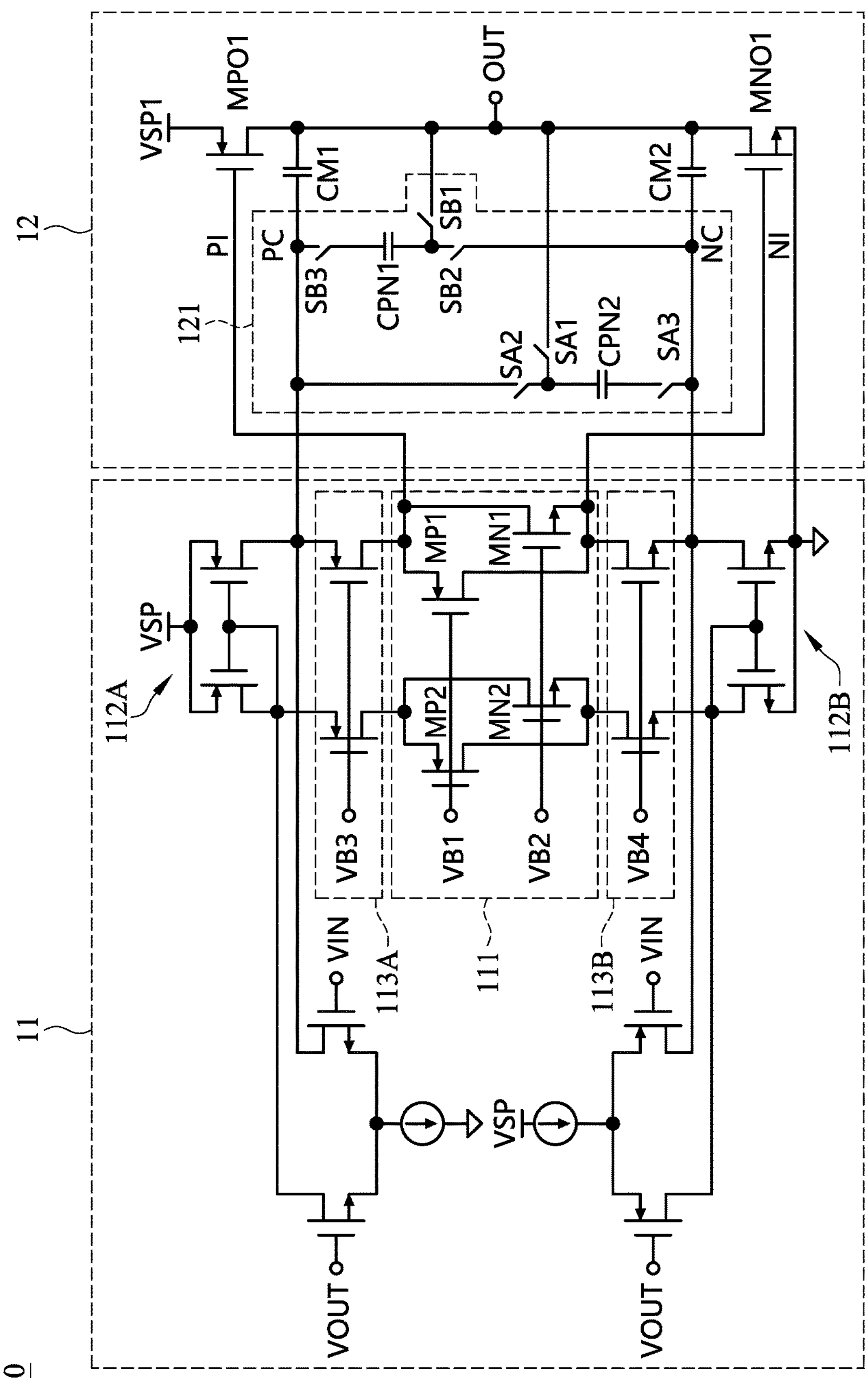
FIG. 3 shows a circuit diagram illustrating an operational amplifier according to a third embodiment of the present invention.

FIG. 3 shows a circuit diagram illustrating an operational amplifier 300 according to a third embodiment of the present invention. The operational amplifier 300 of FIG. 3 is similar to the operational amplifier 200 of FIG. 2 with the following exceptions.

In the embodiment, the first Miller capacitor CM1 is electrically connected between a first connect node PC (instead of the first drive node PI) and the output node OUT, and the second Miller capacitor CM2 is electrically connected between a second connect node NC (instead of the second drive node NI) and the output node OUT. The decoupling capacitor circuit 121 is electrically connected between the first connect node PC and the second connect node NC (instead of between the first drive node PI and the second drive node NI).

In the embodiment, the floating current input stage 11 may further include a first cascade circuit 113A (composed of two transistors (e.g., PMOSs) connected in parallel with their gates coupled together) electrically connected between the first current source 112A and the floating current circuit 111, and a second cascade circuit 113B (composed of two transistors (e.g., NMOSs) connected in parallel with their gates coupled together) electrically connected between the second current source 112B and the floating current circuit 111.

In an alternative embodiment (not shown), the second decoupling capacitor CPN2 and the associated switches SA1-SA3 may be omitted. Further, the first switch SB1 may also be omitted to reduce circuit area.

Although specific embodiments have been illustrated and described, it will be appreciated by those skilled in the art that various modifications may be made without departing from the scope of the present invention, which is intended to be limited solely by the appended claims.

What is claimed is:

1. An operational amplifier, comprising:

a first output transistor and a second output transistor connected in series between two power nodes, the second output transistor having a semiconductor type opposite to the first output transistor, the first output transistor and the second output transistor being electrically coupled at an output node, and gates of the first output transistor and the second output transistor being connected to a first drive node and a second drive node respectively; and a decoupling capacitor circuit electrically connected between the first drive node and the second drive node;

wherein the decoupling capacitor circuit comprises a first decoupling capacitor switchably connected between the first drive node and the second drive node, and the first decoupling capacitor is switchably connected between the first drive node and the output node.

2. The operational amplifier of claim 1, further comprising:

a first Miller capacitor electrically connected between the first drive node and the output node; and a second Miller capacitor electrically connected between the second drive node and the output node.

3. The operational amplifier of claim 1, wherein the decoupling capacitor circuit comprises a decoupling capacitor.

4. The operational amplifier of claim 1, wherein the decoupling capacitor circuit further comprises a second decoupling capacitor switchably connected between the first drive node and the second drive node.

5. The operational amplifier of claim 4, wherein the second decoupling capacitor is switchably connected between the second drive node and the output node.

6. The operational amplifier of claim 1, further comprising:

a floating current input stage including:

a floating current circuit electrically connected between the first drive node and the second drive node.

7. The operational amplifier of claim 6, wherein floating current circuit comprises:

a first floating current source composed of a first floating transistor and a second floating transistor electrically connected in parallel between the first drive node and the second drive node, the first floating transistor having a semiconductor type opposite to the second floating transistor.

8. The operational amplifier of claim 7, wherein floating current circuit further comprises:

a second floating current source composed of a third floating transistor and a fourth floating transistor electrically connected in parallel between the first drive node and the second drive node, the third floating transistor having a semiconductor type opposite to the fourth floating transistor.

9. An operational amplifier, comprising:

a first output transistor and a second output transistor connected in series between two power nodes, the second output transistor having a semiconductor type opposite to the first output transistor, the first output transistor and the second output transistor being electrically coupled at an output node, and gates of the first output transistor and the second output transistor being connected to a first drive node and a second drive node respectively;

a first Miller capacitor electrically connected between a first connect node and the output node;

a second Miller capacitor electrically connected between a second connect node and the output node; and a decoupling capacitor circuit electrically connected between the first connect node and the second connect node;

wherein the decoupling capacitor circuit comprises a first decoupling capacitor switchably connected between the first connect node and the second connect node;

and further wherein the first decoupling capacitor is switchably connected between the first connect node and the output node.

10. The operational amplifier of claim 9, wherein the decoupling capacitor circuit further comprises a second decoupling capacitor switchably connected between the first connect node and the second connect node.

11. The operational amplifier of claim 10, wherein the second decoupling capacitor is switchably connected between the second connect node and the output node.

* * * * *